US010429471B2

(12) United States Patent
Zhao et al.

(10) Patent No.: US 10,429,471 B2
(45) Date of Patent: Oct. 1, 2019

(54) MRI WITH VARIABLE DENSITY SAMPLING

(71) Applicant: KONINKLIJKE PHILIPS N.V., Eindhoven (NL)

(72) Inventors: Chenguang Zhao, Suzhou (CN); Feng Huang, Suzhou (CN); Ming Yang, Suzhou (CN)

(73) Assignee: Koninklijke Philips N.V., Eindhoven (NL)

( * ) Notice: Subject to any disclaimer, the term of this patent is extended or adjusted under 35 U.S.C. 154(b) by 103 days.

(21) Appl. No.: 15/579,623

(22) PCT Filed: Jun. 7, 2016

(86) PCT No.: PCT/EP2016/062819
§ 371 (c)(1),
(2) Date: Dec. 5, 2017

(87) PCT Pub. No.: WO2016/198362
PCT Pub. Date: Dec. 15, 2016

(65) Prior Publication Data
US 2018/0149720 A1    May 31, 2018

(30) Foreign Application Priority Data
Oct. 21, 2015    (EP) .................................... 15190741

(51) Int. Cl.
*G01R 33/48* (2006.01)
*G01R 33/561* (2006.01)

(52) U.S. Cl.
CPC ....... *G01R 33/4826* (2013.01); *G01R 33/482* (2013.01); *G01R 33/4818* (2013.01);
(Continued)

(58) Field of Classification Search
CPC .............. G01R 33/4818; G01R 33/482; G01R 33/4822; G01R 33/4824; G01R 33/4826; G01R 33/561
See application file for complete search history.

(56) References Cited

U.S. PATENT DOCUMENTS 7,408,345 B2   8/2008  Bammer et al.
8,055,048 B2   11/2011 Nielles-Vallespin et al.
(Continued)

OTHER PUBLICATIONS

Pipe et al "Sampling Density Compensation in MRI: Rationale and an Iterative Numerical Solution" Magnetic Resonance in Med. 41: p. 179-186 1999.
(Continued)

*Primary Examiner* — Rishi R Patel (57) ABSTRACT

The invention provides a device for producing a magnetic resonance image. The device comprises a collecting unit adapted for collecting k space samples that are located on a non-Cartesian grid in a non-Cartesian coordinate space or non-uniformly located on a Cartesian grid in a Cartesian coordinate space, the non-Cartesian/Cartesian coordinate space adapted to be decomposed into a plurality of subspaces, each of which extends along one or more coordinate axes of the non-Cartesian/Cartesian coordinate space; a weight calculation unit (203) adapted for calculating a decomposed sample density weight function of the k space samples in each individual subspace and determining a density weight function in the non-Cartesian/Cartesian coordinate space via a multiplication of the decomposed sample density weight functions of the k space samples in the plurality of subspaces; a gridding unit adapted for interpolating the k space samples in the non-Cartesian/Cartesian coordinate space onto a uniform Cartesian grid in a k space based on the density weight function of the k space samples in the non-Cartesian/Cartesian coordinate space; and a
(Continued)

reconstructing unit adapted for reconstructing the magnetic resonance image based on the interpolated k space samples. By means of the invention, fast, preferably on-demand, calculation of the sampling density weights may be achieved.

15 Claims, 3 Drawing Sheets

(52) U.S. Cl.
CPC ..... *G01R 33/4822* (2013.01); *G01R 33/4824* (2013.01); *G01R 33/561* (2013.01)

(56) References Cited

U.S. PATENT DOCUMENTS

| 8,473,028 B2 | 6/2013 | Cook et al. |
| 2004/0258326 A1 | 12/2004 | Lee et al. |
| 2007/0182412 A1 | 8/2007 | Katscher et al. |
| 2011/0089946 A1 | 4/2011 | Griswold et al. |
| 2015/0168522 A1* | 6/2015 | Gulaka .............. G01R 33/4818 324/309 |

OTHER PUBLICATIONS

Pipe et al "Reconstructing MR Images From Undersampled Data: Data-Weighting Considerations" Magnetic Resonance in Med. 43: p. 867-875 (2000).

Weller Daniels et al: "Augmented Lagrangian with Variable Splitting for Faster Non-Cartesian SPIRiT MR Image Reconstruction",IEEE Transactions on Medical Imaging, IEEE Service Center, Piscataway, NJ, US, vol. 33, No. 2, Oct. 9, 2013 (Oct. 9, 2013), pp. 351-361.

Wei Lin et al: "Generalized GRAPPA operators for wider spiral bands: Rapid self-calibrated parallel reconstruction for variable density spiral MRI",Magnetic Resonance in Medicine,vol. 66, No. 4, Apr. 5, 2011 (Apr. 5, 2011), pp. 1067-1078.

Bydder M et al: "Evaluation of optimal Density weighting for regridding". Magnetic Resonance Imaging, Elsevier Science, Tarrytown, NY, US, vol. 25, No. 5, Jun. 1, 2007 (Jun. 1, 2007),pp. 695-702.

Thedens D R, Jiang X: "Efficient three-dimensional reconstruction for non-Cartesian acquisitions". Proceedings of the International Society for Magnetic Resonance in Medicine, 12th Annual Meeting and Exhibition, Kyoto,Japan, May 15-21, 2004,vol. 12, May 1, 2004 (May 1, 2004), p. 2138.

Johnson, K. O. and J. G. Pipe (2009). "Convolution Kernel Design and Efficient Algorithm for Sampling Density Correction." Magnetic Resonance in Medicine 61: 439-447.

Lin, W., F. Huang, et al. (2010). "GRAPPA Operator for Wider Radial Bands (GROWL) with Optimally Regularized Self-Calibration." Magnetic Resonance in Medicine 64: 757-766.

Pauly, J. (2005). "Non-Cartesian Reconstruction." http://mri-q.com/uploads/3/2/7/4/3274160/pauly-non-cartesian_recon.pdf.

Hoge, R. D., Kwan, R. K. S. and Bruce Pike, G. (1997), Density compensation functions for spiral MRI. Magn Reson Med, 38: 117-128. doi: 10.1002/mrm.1910380117.

Mitsouras, D., Mulkem, R. V. and Rybicki, F. J. (2008), Fast, exact kspace sample density compensation for trajectories composed of rotationally symmetric segments, and the SNR optimized image reconstruction from nonCartesian samples. Magn Reson Med, 60: 339-349. doi: 10.1002/mrm.21597.

* cited by examiner

MRI WITH VARIABLE DENSITY SAMPLING

CROSS REFERENCE TO RELATED APPLICATIONS

This application is a U.S. national phase application of International Application No. PCT/EP2016/062819, filed on Jun. 7, 2016, which claims the benefit of Application Serial No. PCT/CN2015/080971 filed on Jun. 8, 2015 and Application Serial No. EP 15190741.7 filed on Oct. 21, 2015, both of which are incorporated herein by reference.

FIELD OF THE INVENTION

The present invention generally relates to a method and a device for producing a magnetic resonance image from k space samples collected from a subject, e.g., a patient, and especially to a method and a device for producing the magnetic resonance image from k space samples located in a curvilinear coordinate space.

BACKGROUND OF THE INVENTION

In MR imaging, a k space is usually used to hold data samples acquired from a subject, e.g., a patient. The locations of the data samples in the k space may be one of the concerns during reconstruction of an image of the subject from the data samples. Most conventional methods for data collection collect the data samples uniformly on the Cartesian grid in the k space. This allows performing image reconstruction by means of direct implementation of fast Fourier transform (FFT) algorithms on the data samples in the k space.

However, some methods may collect data samples located on a non-Cartesian grid or located non-uniformly on a Cartesian grid in a k space. In this case, it is necessary to grid such collected data samples uniformly onto the Cartesian grid in the k space. Such a process may be referred to as a gridding process. After the gridding process, the data samples may be subjected to fast Fourier transform (FFT) algorithms to achieve image reconstruction. The gridding process normally consists of several standard steps including density weight estimation, kernel convolution and roll-off correction. The first step, density weight estimation, in the gridding process is to estimate sample density weights for the data samples in the k space to compensate for non-uniformity of the sampling.

There are various methods for estimating the sample density weights, including analytical methods and iterative methods. The analytical methods can be applied only in rare cases. The iterative methods can be applied universally to any sampling patterns in which the data samples are acquired. However, for each iteration, an order of $O(N \cdot L^M)$ operations is needed, with N, L, M being a number of samples, a size of a convolution kernel to be used in the gridding process and a dimension of a k-space, respectively. Therefore, time efficiency could be an issue with a huge number of samples or with a large convolution kernel array size. Furthermore, using the iterative methods, the sample density weights normally must be prepared before image reconstruction starts; if the k-space trajectory changes during a scanning time period, the initial sample density weights do not apply and a recalculation of the sample density weights at scan time is prohibitive due to the high computation load.

SUMMARY OF THE INVENTION

Therefore, it would be desirable to have a device or a method which provides fast, preferably—on-demand, calculation of the sampling density weights.

In one aspect, the invention provides a device for producing a magnetic resonance image. The device comprises a collecting unit adapted for collecting k space samples that are located on a non-Cartesian grid in a non-Cartesian coordinate space or non-uniformly located on a Cartesian grid in a Cartesian coordinate space, the non-Cartesian/Cartesian coordinate space adapted to be decomposed into a plurality of subspaces, each of which is spanned by one or more coordinate axes of the non-Cartesian/Cartesian coordinate space; a weight calculation unit (203) adapted for calculating a decomposed sample density weight function of the k space samples in each individual subspace and determining a density weight function in the non-Cartesian/Cartesian coordinate space via a multiplication of the decomposed sample density weight functions of the k space samples in the plurality of subspaces; a gridding unit adapted for interpolating the k space samples in the non-Cartesian/Cartesian coordinate space onto a uniform Cartesian grid in a k space based on the density weight function of the k space samples in the non-Cartesian/Cartesian coordinate space; and a reconstructing unit adapted for reconstructing the magnetic resonance image based on the interpolated k space samples.

The invention recognizes that a density weight function for k space data samples in a higher dimensional space may be calculated as a multiplication of decomposed sample density weight functions in a plurality of lower dimensional subspaces spanned by one or more coordinate axes of the higher dimensional space. Therefore, the decomposed sample density weight functions in each dimension reduced subspace may be calculated individually, instead of directly calculating the density weight function in the higher dimensional space by an iterative method which may relate to high time cost. This improves time efficiency in the calculation of the density weight function and thus makes it feasible to calculate the density weight function for the k space data samples on-demand when the k-space trajectory along which the k space data samples are acquired changes during a scanning time period.

In one embodiment, the k space samples are acquired by a MRI apparatus along any one of radial trajectories and a constant angular rate spiral trajectory, the radial trajectories including 2D uniform or non-uniform angle step trajectories and 3D uniform or non-uniform angle step trajectories. In this embodiment, for k space samples acquired along above-defined trajectories, the density weight function can be determined in a fast way. Even if the trajectory for acquiring the k space samples is changed during the scan, the device of the invention enables a recalculation of the sample density weights at scan time due to its high time efficiency.

In another embodiment, the device of the invention is especially applicable to an orthogonal coordinate space. It may be understood that the orthogonal coordinate space can be decomposed into subspaces that are orthogonal to each other. The dimensions of the subspaces can be one or greater than one. Since the axes of the orthogonal coordinate space are orthogonal to each other, the subspaces spanned by one or more axes are orthogonal to each other as well. In this case, due to the orthogonality of the subspaces, the projection of a density weight in one subspace onto another subspace leads to no components in that subspace, so that the weights in each individual subspace can be calculated independently, and the overall weight function can be calculated accurately via the multiplication of the density weights in subspaces.

In a further embodiment, the non-Cartesian/Cartesian coordinate space is a 2D polar coordinate space which is adapted to be decomposed into a first subspace and a second subspace orthogonal to each other, and wherein the first subspace and the second subspace are along a radial direction and an angular direction of the 2D polar coordinate space, respectively. In this embodiment, a density weight function for k space data samples in the 2D polar coordinate space may be calculated as the multiplication of density weight functions along the radial direction and the angular direction. It transforms the calculation of the density weight function in a 2D space into the calculation of respective density weights in two 1D subspaces and thus achieves a high time efficiency.

In a further embodiment, the non-Cartesian/Cartesian coordinate space is a 3D spherical coordinate space which is adapted to be decomposed into a first subspace and a second subspace orthogonal to each other, and wherein the first subspace and the second subspace are along a radial direction and a spherical surface of the 3D spherical coordinate space, respectively. In this embodiment, a density weight function for k space data samples in the 3D spherical coordinate space may be calculated as the multiplication of density weight functions along the radial direction and the spherical surface. It transforms the calculation of the density weight function in a 3D space into the calculation of respective density weights in a 1D subspace and a 2D subspace and can be used to improve the time efficiency for determining the density weight functions for k space samples in the 3D spherical coordinate space.

In a further embodiment, the non-Cartesian/Cartesian coordinate space is a 3D spherical coordinate space which is adapted to be decomposed into a first subspace, a second subspace and a third subspace orthogonal to each other, and wherein the first subspace, the second subspace and the third subspace are along a radial direction, an azimuthal direction and a polar angular direction of the 3D spherical coordinate space, respectively. In this embodiment, a density weight function for k space data samples in the 3D spherical coordinate space may be calculated as the multiplication of density weight functions along the radial direction, the azimuthal direction and the polar angular direction. It transforms the calculation of the density weight function in a 3D space into the calculation of respective density weights in three 1D subspaces and thus can be used to improve the time efficiency for determining the density weight functions for k space samples in the 3D spherical coordinate space.

In a still further embodiment, the weight calculation unit is adapted for calculating a sample density weight in each individual subspace in an analytic or iterative way.

By transforming an iterative calculation of the density weight function in a higher dimensional space into the calculation of the density weights in respective lower dimensional subspaces and calculating the sample density weight in each individual lower dimensional subspace in an analytic or iterative way, the density weight function for k space data samples may be calculated in a fast way.

In another aspect, the invention provides a MRI apparatus comprising an acquisition unit adapted for acquiring k space samples in a non-Cartesian/Cartesian coordinate space from a subject; and a device for producing a magnetic resonance image according to the invention.

In a further aspect, the invention provides a computer program product comprising instructions executable to perform a method for producing a magnetic resonance image according to the invention.

Various aspects and features of the disclosure are described in further detail below. And other objects and advantages of the present invention will become more apparent and will be easily understood with reference to the description made in combination with the accompanying drawings.

DESCRIPTION OF THE DRAWINGS

The present invention will be described and explained hereinafter in more detail in combination with embodiments and with reference to the drawings, wherein.

The same reference signs in the figures indicate similar or corresponding features and/or functionalities.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn to scale for illustrative purposes.

DETAILED DESCRIPTION

Figure 1:
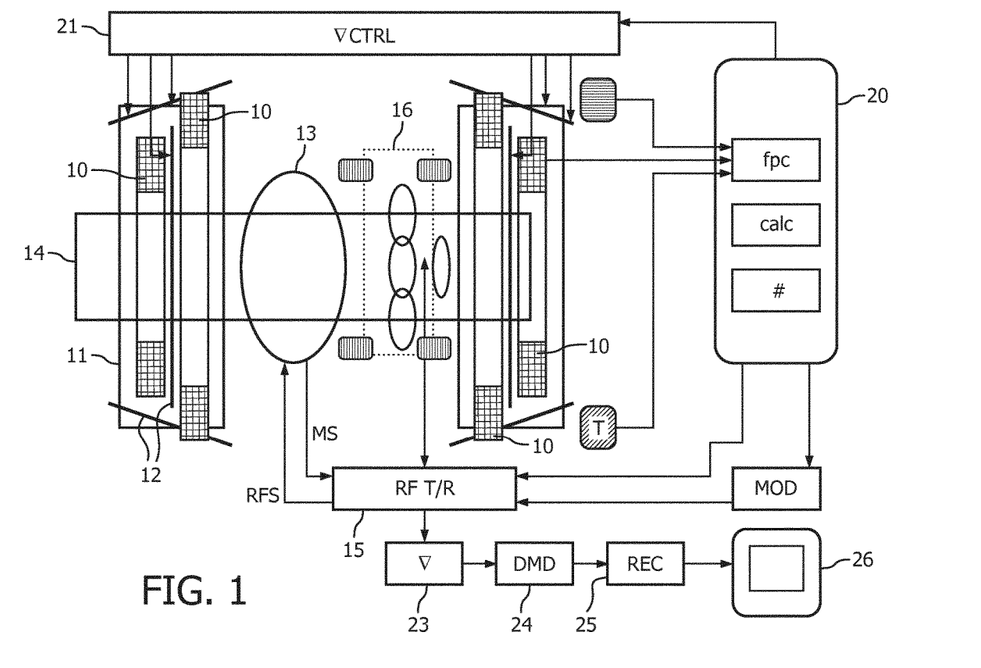
FIG. 1 shows a MRI apparatus which includes a device for producing a magnetic resonance image according to the present invention.

FIG. 1 shows diagrammatically a magnetic resonance imaging (MRI) apparatus in which the device of the invention is used. The MRI apparatus includes a main magnet with a set of main coils 10 whereby the steady, uniform magnetic field is generated. The main coils are constructed, for example, in such a manner that they form a bore to enclose a tunnel-shaped examination space. The patient to be examined is placed on a patient carrier which is slid into this tunnel-shaped examination space. The MRI apparatus also includes a number of gradient coils 11, 12 whereby magnetic fields exhibiting spatial variations, notably in the form of temporary gradients in individual directions, are generated so as to be superposed on the uniform magnetic field. The gradient coils 11, 12 are controlled by a gradient control 21. The magnetic resonance imaging system also includes transmission and receiving antennae (coils or coil arrays) 13, 16 for generating the RF excitation pulses and for picking up the magnetic resonance signals, respectively. Please note that the same antennae may be used for both transmission and receiving, or individual antennae may be used for transmission and receiving separately.

The transmission and receiving coil 13 is connected to an electronic transmission and receiving circuit 15. The electronic transmission and receiving circuit 15 is connected to a preamplifier 23. The preamplifier 23 amplifies the magnetic resonance signal received by the receiving coil and the amplified magnetic resonance signal is applied to a demodulator 24 by which the amplified magnetic resonance signals (MS) are demodulated. The demodulated magnetic resonance signals (DMS) are applied to a reconstruction unit 25.

The reconstruction unit 25 derives one or more image signals from the demodulated magnetic resonance signals (DMS), which image signals represent the image information of the imaged part of the object to be examined. The image signals are output to a monitor 26 for display.

The magnetic resonance imaging system according to the invention is also provided with a control unit 20, for example in the form of a computer which includes a (micro) processor. The control unit 20 may control all kinds of operations of the MRI apparatus.

Those skilled in the art may understand that the device for producing a magnetic resonance image from data samples of the invention may be included in the reconstruction unit 25.

Figure 2:
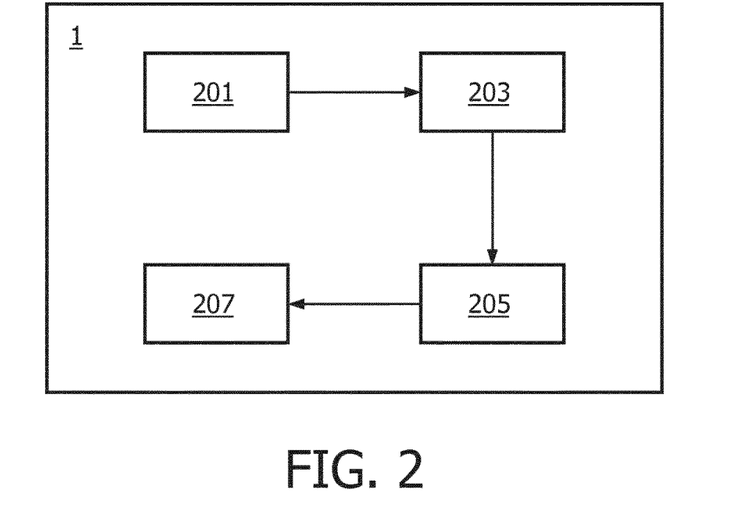
FIG. 2 illustrates a detailed block diagram of the device for producing a magnetic resonance image according to the present invention.

FIG. 2 illustrates a device 1 for producing a magnetic resonance image according to the present application. The device 1 comprises a collecting unit 201 for collecting k space samples from a subject, such as a patient, to be imaged by MRI. The collected k space samples are distributed on the non-Cartesian grid or non-uniformly on the Cartesian grid. In one embodiment, the collected k space samples are particularly distributed in an orthogonal non-Cartesian/Cartesian coordinate space. The non-Cartesian/Cartesian coordinate space in which the collected k space samples are located is adapted to be decomposed into a plurality of subspaces, each subspace is along one or more coordinate axes of the curvilinear coordinate space. It is preferred that the non-Cartesian/Cartesian coordinate space is adapted to be decomposed into a plurality of subspaces orthogonal to each other. In the case of an orthogonal coordinate space, the plurality of subspaces may be along the respective one or two axes thereof which are orthogonal to each other. In this case, accurate sample density weights for the data samples in a higher dimensional non-Cartesian/Cartesian coordinate space may be determined via a multiplication of decomposed sample density weights in lower dimensional subspaces using the invention.

For example, when the non-Cartesian/Cartesian coordinate space is a 2D polar coordinate space, it may be decomposed into a first subspace and a second subspace, wherein the first subspace and the second subspace are along a radial axis direction and an angular axis direction of the 2D polar coordinate space, respectively.

When the non-Cartesian/Cartesian coordinate space is a 3D spherical coordinate space, it may be decomposed into a first subspace and a second subspace orthogonal to each other, the first subspace and the second subspace are along a radial axis direction and a spherical surface direction of the 3D spherical coordinate space, respectively. Or, if the 3D spherical coordinate space may be decomposed into a first subspace, a second subspace and a third subspace orthogonal to each other, the first subspace, the second subspace and the third subspace are along a radial axis direction, an azimuthal axis direction and a polar angular axis direction of the 3D spherical coordinate space, respectively.

Which kind of coordinate space the collected k space samples are located in relates to how the k space samples are collected, in particular, along which trajectories the k space samples are collected. Generally, according to the invention, the k space samples may be acquired by a MRI apparatus, as described above, along any one of radial trajectories and a spiral trajectory, the radial trajectories include 2D uniform or non uniform angle step trajectories and 3D uniform or non uniform angle step trajectories and the spiral trajectory may particularly be a constant angular rate spiral trajectory. In one embodiment, the k space samples may be acquired along a 2D radial or 3D stack of stars trajectory; in this case, the collected k space samples may be regarded as being located in a 2D polar coordinate space. In another embodiment, the k space samples may be acquired along a 3D koosh-ball radial trajectory; in this case, the collected k space samples may be regarded as being located in a 3D spherical coordinate space.

After the non-Cartesian/Cartesian coordinate space is decomposed into a plurality of subspaces, a decomposed sample density weight in each individual subspace may be calculated and then a density weight function in the non-Cartesian/Cartesian coordinate space may be calculated based on the decomposed sample density weight in each subspace. The device 1 of the invention further comprises a weight calculation unit 203. The weight calculation unit 203 receives positions of the collected k space samples in the non-Cartesian/Cartesian coordinate space and calculates the density weight function for the collected k space samples based on the positions.

First of all, the weight calculation unit 203 of the invention calculates a decomposed sample density weight for the collected k space samples in each individual subspace. The decomposed sample density weight in a subspace may be a function or a vector relating to the positions of the collected k space samples in the subspace. In particular, the decomposed sample density weight in each subspace may be calculated based on the positions of the collected k space samples in the corresponding subspace and in an analytical or iterative way.

The analytical methods attempt to define the corresponding area of each data sample which is proportional to the weight. As indicated by referring to FIG. 3 below, sparse sampling yields large weights while dense sampling produces low weights. In an example, for uniform radial k-space trajectory, the weight of a sample is generally determined as being proportional to the reciprocal of its distance to the k space center.

The iterative methods are mathematical procedures that generate a sequence of improving approximate solutions for a class of problems, which are well known in computational mathematics. The iterative methods had been proposed to calculate the density weight function by Pipe et al. The following documents may be incorporated as references: Pipe, J. G. and P. Menon (1999). "Sampling Density Compensation in MRI: Rationale and an Iterative Numerical Solution." Magnetic Resonance in Medicine 41: 179-186.) and Pipe, J. G. (2000). "Reconstructing MR Images From Undersampled Data: Data-Weighting Considerations." Magnetic Resonance in Medicine 43: 867-875.

Next, the weight calculation unit 203 may determine the sample density function for the collected k space samples via a multiplication of the calculated decomposed sample density weights in individual subspaces.

The following will describe specific processing of the weight calculation unit 203 by referring to radial and spiral k space trajectories along which the k space samples are acquired. The person skilled in the art may understand this is only for the purpose of illustration of the invention, it does not mean that the invention is limited to be used in such trajectories only, instead, they may understand that the invention may apply to k space samples acquired along other kinds of trajectories, such as a 3D stack of stars trajectory as mentioned above.

For both radial and spiral k-space trajectories, the acquired k space samples may be located in radial and angle coordinates in a polar coordinate system (2D) or a spherical coordinate system (3D).

According to the invention, in the weight calculation unit 203, the decomposed sample density variations along the radial and angle directions in the above coordinate system may be processed separately to obtain the sample density weights along the radial and angle directions, respectively, and the final density weight on each sample is generated by multiplication of the decomposed sample density weights along the radial and angle directions.

Let $w(\theta)$ denote weight of angle $\theta$, which is determined by how close it is to or how far it is from its neighbourhood angles along the angle direction. Let $w(r)$ denote weights along the radial direction, which characterizes how the samples scatter out when they move away from the k-space centre along the radial lines. The density weight function $w(r, \theta)$ at sample $(r, \theta)$ can then be calculated using $w(r, \theta) = w(r) \cdot w(\theta)$ in the weight calculation unit 203.

In view of a radial trajectory, the weights along the radial direction may be calculated in an analytical way while the weight of angle may be calculated as a constant or in an iterative way. In particular, for constant angle rate radial trajectory, the weights of the angle for the k space samples may be a constant while for, e.g., radial trajectory with angular sampling with golden angle step, the weights of the angle for the k space samples may be calculated in the iterative way. The golden angle may be around 111.25 degrees. It may be contemplated that for a radial trajectory with another angle step, the weights of the angle for the k space samples may be calculated in a similar way, for example for a radial trajectory with a half of the golden angle step.

Figure 3:
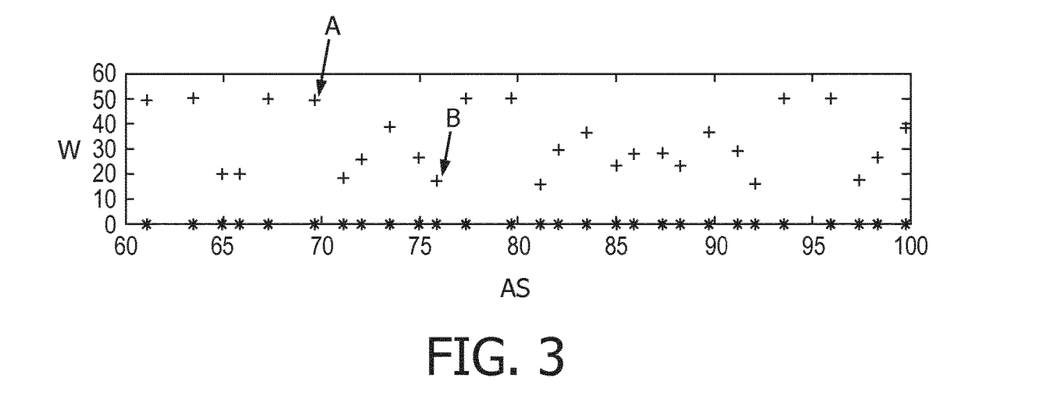
FIG. 3 illustrates the weight of angle w(θ) in respect to angular samples for the radial trajectory with angular sampling with golden angle step.

FIG. 3 illustrates the weight (W) of angle $w(\theta)$ in respect to angular samples (AS) for the radial trajectory with angular sampling with golden angle step. The angular samples are shown along an abscissa axis as stars (*) and the $w(\theta)$ is shown along a vertical axis as plus signs (+). As indicated by two inset arrows A and B shown in FIG. 3, a sparse angular sampling yields large weights while dense sampling produces low weights. In particular, the angular sampling corresponding to A is sparse and the weight indicated by A is large while the angular sampling corresponding to B is dense and the weight indicated by B is low.

Figure 4:
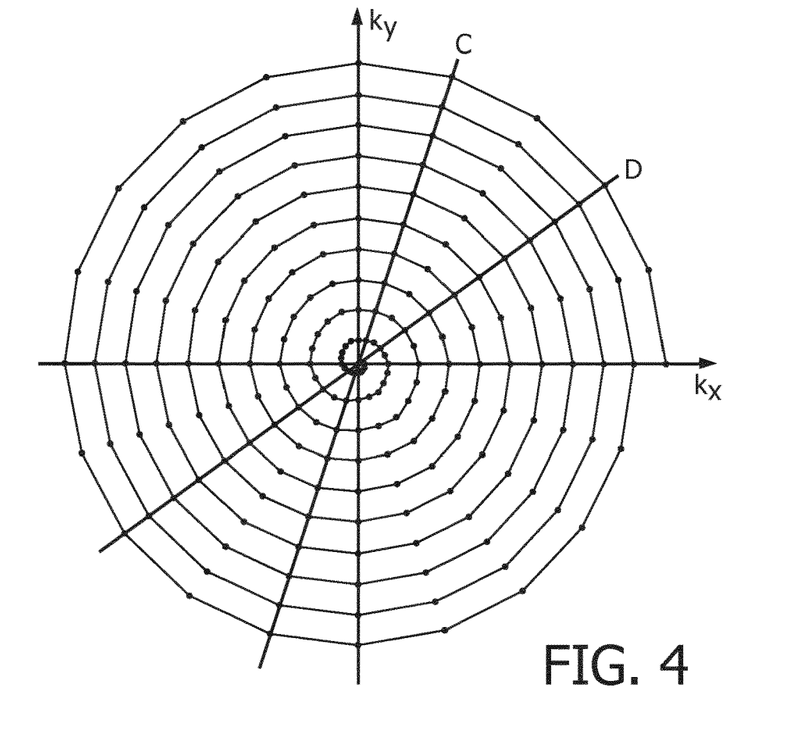
FIG. 4 illustrates k space samples in a constant angular rate spiral acquisition.

In view of a spiral trajectory, the sample weight along the radial direction cannot be expressed in an analytical form; instead, it may be calculated in an iterative way. FIG. 4 illustrates k space samples in a constant angular rate spiral acquisition. In this case, the sample density weights along the radial direction, i.e., diameters, and along the circumference, i.e., angular direction, are calculated for individual k space samples independently. Two of the diameters are shown as black solid lines C and D in FIG. 4 as examples. The density weight function for the k space samples may be calculated by a product of the sample density weight along the radial direction and the sample density weight along the circumference.

It may be understood that the k space samples acquired along both radial and spiral k-space trajectories may be located in an orthogonal coordinate space. However, it may be understood that the invention may be applied to the k space samples acquired which are located in non-orthogonal coordinate spaces also, although sample distributions in non-orthogonal coordinate spaces is not a common practice. The axes of the non-orthogonal coordinate spaces are not orthogonal to each other. Both the orthogonal coordinate space and the non-orthogonal coordinate space may be included in the non-Cartesian/Cartesian coordinate space and as examples of the non-Cartesian/Cartesian coordinate space.

In the non-orthogonal case, the overall weights of the k space samples calculated by a multiplication of weights from subspaces give an approximation of the optimal weight values. The weight deviation in k space in effect is equivalent to a low pass filter in image domain. In practice, slight weight deviations still lead to good image quality. And our experiments demonstrate that non-Cartesian reconstruction of the invention is quite robust to such weight deviations or errors. Therefore, this invention offers a benefit to non-orthogonal non-Cartesian/Cartesian space as well.

The invention may be contemplated to be applied to the k space samples non-uniformly located in a Cartesian coordinate space also.

Referring back to FIG. 2, the device 1 of the invention also includes a gridding unit 205 and a reconstructing unit 207. The gridding unit 205 receives the density weight function calculated in the weight calculation unit 203 and performs a gridding process on the data samples. In particular, the gridding unit 205 interpolates the k space samples in the non-Cartesian/Cartesian coordinate space uniformly onto the Cartesian grid in a k space based on the calculated density weight function for compensating the non-uniform sampling of the k space samples. The reconstructing unit 207 performs fast Fourier transform (FFT) algorithms on the interpolated k space samples to reconstruct a magnetic resonance image.

Although the device 1 for producing a magnetic resonance image of the invention is described with reference to the detailed illustration of individual units shown in FIG. 2, it would be contemplated that any of the above units may be combined or subdivided in order to achieve the same function; furthermore, it would be contemplated that any of the above units, except the reconstructing unit 207, may be incorporated into any hardware having processing capability in an existing MRI system, for example a data acquiring processor for acquiring a plurality of channel data sets or a reconstructing processor for reconstructing an image of a subject while the reconstructing unit 207 is included in the reconstructing processor. In one embodiment, the device 1 of the invention is incorporated into the reconstructing processor as a whole. In this case, the k space samples may be acquired from the subject along a predefined trajectory in an acquiring unit and transmitted to the device 1 of the invention. By referring to FIG. 1, the transmission and receiving antennae 13 and 16, the electronic transmission and receiving circuit 15, the preamplifier 23 and the demodulator 24 together may function as the acquiring unit and the reconstruction unit 25 may function as the device of the invention.

It may be contemplated that the individual units of the apparatus of the invention may be achieved by any one of software, hardware or firmware.

Figure 5:
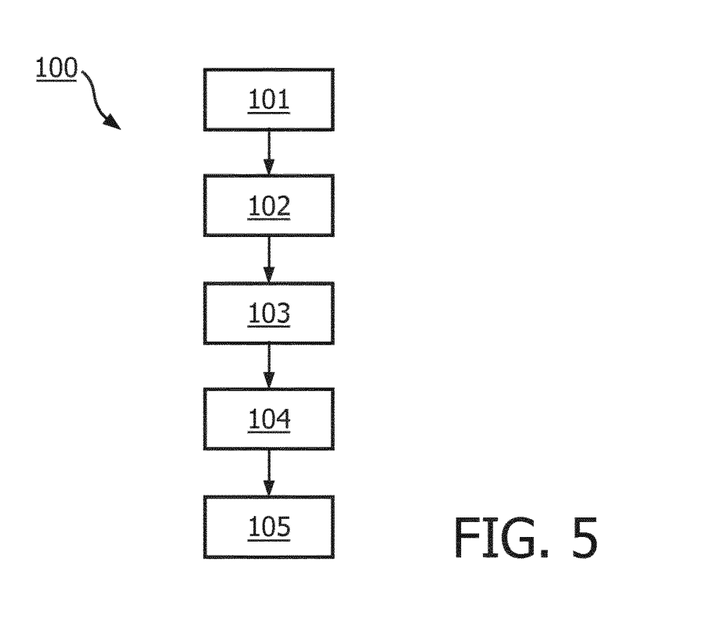
FIG. 5 shows a flowchart of a method 100 of the invention for producing a magnetic resonance image.

FIG. 5 shows a flowchart of a method 100 of the invention for producing a magnetic resonance image. In a step 101, k space samples are collected or acquired to be located in a non-Cartesian/Cartesian coordinate space. In this step, especially the positions of the k space samples in the non-Cartesian/Cartesian coordinate space are collected. The non-Cartesian/Cartesian coordinate space may be decomposed into a plurality of subspaces, each subspace spanned by one or more coordinate axes of the non-Cartesian/Cartesian coordinate space. It is preferred that the non-Cartesian/Cartesian coordinate space is an orthogonal coordinate space in which the coordinate axes are orthogonal to each other. In one embodiment, the non-Cartesian/Cartesian coordinate space is a 2D polar coordinate space or a 3D spherical coordinate space.

It may be contemplated that the k space samples may be acquired by an acquiring processor of a MRI apparatus and then collected to be used in the method or device of the invention, or the collection or acquisition of the k space samples may be incorporated into the acquiring processor of the MRI apparatus directly and then the collecting unit and the collecting step of the invention may be omitted.

In a step 102, a sample density weight of the k space samples in each individual subspace is calculated, especially based on the positions of the k space samples in corresponding subspace. The sample density weight may be a function or a vector. In particular, the sample density weight of the k space samples in each subspace may be calculated in an analytical way or an iterative way.

In a step 103, based on the calculated sample density weight of the k space samples in each subspace, a density weight function of the k space samples in the curvilinear coordinate space may be determined via a multiplication of the calculated sample density weights in each subspace.

In a step 104, the determined density weight function of the k space samples may be used in a gridding process of the k space samples in the non-Cartesian/Cartesian coordinate space so as to make the k space samples be uniformly interpolated onto a Cartesian grid in a k space.

In a step 105, the uniformly interpolated k space samples on the Cartesian grid may be subjected to a fast Fourier transform (FFT) algorithm to obtain a reconstructed MRI image.

It may be contemplated that any steps as described above may be combined or subdivided in order to achieve the same function or for achieving advantages.

Please note that the apparatus and the method according to the present invention should not be limited to that mentioned above only. It will be apparent to those skilled in the art that the various aspects of the invention claimed may be practiced in other examples that depart from these specific details.

Furthermore, the mere fact that certain measures are recited in mutually different dependent claims does not indicate that a combination of these measures cannot be used to advantage.

It should be noted that the above-mentioned embodiments illustrate rather than limit the invention and that those skilled in the art would be able to design alternative embodiments without departing from the scope of the appended claims. In the claims, any reference signs placed between parentheses shall not be construed as limiting the claim. The word "comprising" does not exclude the presence of elements or steps not listed in a claim or in the description. The word "a" or "an" preceding an element does not exclude the presence of a plurality of such elements. In the product claims enumerating several units, several of these units can be embodied by one and the same item of software and/or hardware.

The invention claimed is:

1. A device for producing a magnetic resonance image comprising:
   a collecting unit adapted for collecting k space samples that are located on a non-Cartesian grid in a non-Cartesian coordinate space or non-uniformly located on a Cartesian grid in a Cartesian coordinate space, the non-Cartesian/Cartesian coordinate space adapted to be decomposed into a plurality of subspaces, each of which is spanned by one or more coordinate axes of the non-Cartesian/Cartesian coordinate space;
   a weight calculation unit adapted for calculating a decomposed sample density weight function of the k space samples in each individual subspace and determining the density weight function in the non-Cartesian/Cartesian coordinate space via a multiplication of the decomposed sample density weight functions of the k space samples in the plurality of subspaces;
   a gridding unit adapted for interpolating the k space samples in the non-Cartesian/Cartesian coordinate space onto a uniform Cartesian grid in a k space based on the determined density weight function of the k space samples in the non-Cartesian/Cartesian coordinate space; and
   a reconstructing unit adapted for reconstructing the magnetic resonance image based on the interpolated k space samples.

2. The device of claim 1, wherein
   the k space samples are acquired by the collecting unit along any one of radial trajectories and a constant angular rate spiral trajectory, the radial trajectories including 2D uniform or nonuniform angle step trajectories and 3D uniform or non-uniform angle step trajectories.

3. The device of claim 1, wherein
   the non-Cartesian/Cartesian coordinate space is an orthogonal non-Cartesian/Cartesian coordinate space.

4. The device of claim 3, wherein
   the non-Cartesian/Cartesian coordinate space is a 2D polar coordinate space which is adapted to be decomposed into a first subspace and a second subspace, and wherein
   the first subspace and the second subspace are along a radial direction and an angular direction of the 2D polar coordinate space, respectively.

5. The device of claim 4, wherein
   the k space samples are acquired along a 2D radial or 3D stack of stars trajectory.

6. The device of claim 3, wherein
   the non-Cartesian/Cartesian coordinate space is a 3D spherical coordinate space which is adapted to be decomposed into a first subspace and a second subspace orthogonal to each other, and wherein
   the first subspace and the second subspace are along a radial direction and a spherical surface of the 3D spherical coordinate space, respectively.

7. The device of claim 3, wherein
   the non-Cartesian/Cartesian coordinate space is a 3D spherical coordinate space which is adapted to be decomposed into a first subspace, a second subspace and a third subspace orthogonal to each other, and wherein
   the first subspace, the second subspace and the third subspace are along a radial direction, an azimuthal direction and a polar angular direction of the 3D spherical coordinate space, respectively.

8. The device of claim 7, wherein
   the k space samples are acquired along a 3D koosh-ball radial trajectory.

9. The device of claim 1, wherein
   the weight calculation unit is adapted for calculating a sample density weight in each individual subspace in an analytic or iterative way.

10. A method for producing a magnetic resonance image comprising collecting k space samples that are located on a non-Cartesian grid in a non-Cartesian coordinate space or non-uniformly located on a Cartesian grid in a Cartesian coordinate space, the non-Cartesian/Cartesian coordinate space adapted to be decomposed into a plurality of subspaces, each of which is spanned by one or more coordinate axes of the non-Cartesian/Cartesian coordinate space;

calculating a decomposed sample density weight function of the k space samples in each individual subspace;

determining a density weight function of the k space samples in the non-Cartesian/Cartesian coordinate space via a multiplication of the decomposed sample density weight functions of the k space samples in the plurality of subspaces;

interpolating the k space samples in the non-Cartesian/Cartesian coordinate space onto a uniform Cartesian grid in a k space based on the determined density weight function; and reconstructing the magnetic resonance image based on the interpolated k space samples.

11. The method of claim 10, wherein
the non-Cartesian/Cartesian coordinate space is a 2D polar coordinate space which is adapted to be decomposed into a first subspace and a second subspace orthogonal to each other, and wherein
the first subspace and the second subspace are along a radial direction and an angular direction of the 2D polar coordinate space, respectively.

12. The method of claim 10, wherein
the non-Cartesian/Cartesian coordinate space is a 3D spherical coordinate space which is adapted to be decomposed into a first subspace and a second subspace orthogonal to each other, and wherein
the first subspace and the second subspace are along a radial direction and a spherical surface of the 3D spherical coordinate space, respectively.

13. The method of claim 10, wherein
the non-Cartesian/Cartesian coordinate space is a 3D spherical coordinate space which is adapted to be decomposed into a first subspace, a second subspace and a third subspace orthogonal to each other, and wherein
the first subspace, the second subspace and the third subspace are along a radial direction, an azimuthal direction and a polar angular direction of the 3D spherical coordinate space, respectively.

14. The MRI apparatus comprising
an acquisition unit adapted for acquiring k space samples in a non-Cartesian/Cartesian coordinate space from a subject; and
a device for producing a magnetic resonance image according claim 1.

15. A non-transitory computer-readable medium comprising instructions executable to perform the method as set forth in claim 10.

* * * * *